United States Patent
Tung

(10) Patent No.: US 6,885,277 B2
(45) Date of Patent: Apr. 26, 2005

(54) EXTERNALLY ADJUSTABLE IMPEDANCE TRANSFORMER

(76) Inventor: Kung-Chao Tung, No. 24, Chi E. St., Jungjeng Chiu, Taipei (TW)

( * ) Notice: Subject to any disclaimer, the term of this patent is extended or adjusted under 35 U.S.C. 154(b) by 40 days.

(21) Appl. No.: 10/241,590

(22) Filed: Sep. 12, 2002

(65) Prior Publication Data

US 2004/0051620 A1 Mar. 18, 2004

(51) Int. Cl.[7] .............................................. H01F 5/00
(52) U.S. Cl. ...................... 336/200; 336/205; 336/206; 324/234; 324/236; 324/242; 324/262
(58) Field of Search ............................... 336/200, 205, 336/206; 324/234, 236, 242, 262

(56) References Cited

U.S. PATENT DOCUMENTS 5,262,722 A * 11/1993 Hedengren et al. ......... 324/242

FOREIGN PATENT DOCUMENTS

JP        05135968 A  *  6/1993

* cited by examiner

*Primary Examiner*—Elvin Enad
*Assistant Examiner*—Jennifer A. Poker
(74) *Attorney, Agent, or Firm*—Troxell Law Office, PLLC

(57) ABSTRACT

An externally adjustable RF impedance matching mechanism comprises an upper lid and a base containing a circuit element board therebetween. One or more than one precise adjustment device for adjusting impedance value are provided under the upper lid. Impedance adjustment is carried out by manually turning setting screws associated with the aid of spring force. Heat conductive material is coated between the circuit board and the base so that the device is able to operated at a high power. The expensive material such as ceramic is used in forming the coil board only so that material and the production cost are low.

7 Claims, 5 Drawing Sheets

EXTERNALLY ADJUSTABLE IMPEDANCE TRANSFORMER

BACKGROUND OF THE INVENTION

1. Field of the Invention

The present invention relates to an externally adjustable RF impedance matching mechanism and more particularly, to a dexterously constructed RF substrate layout and impedance matching mechanism design enable to manual adjust the impedance value from outside of the enclosure.

2. Description of the Prior Art

In supplying electric power from a source to a load with a favorable impedance matching state, it is important to use an effective impedance network or mechanism. Thereby adjusting the line inductance to match the load capacitance in the most optimistic condition is the crucial task for the RF power transmission.

In a conventional impedance matching structure shown in FIG. 4, a circuit element 81 with its board is mounted on a base 82, and a lid 83 covers over the base 82 containing the circuit 81 therein. The circuit element 81 including its substrate in one unit is enclosed by ceramic material so as to easily dissipate the heat generated by the power transmission through its impedance matching circuit and protects the element 81 from thermal destruction. But by so the production cost is high.

Besides, the circuit element 81 constructed as such is then secured mounting to the base 82 with fixing saddles 84 at two sides thereof such that the electric board entraining the circuit element 81 will be deformed owing to thermal expansion. Further, such thermal expansion of the circuit board leads to loosening of the engagement between the circuit board and the thermal conductive base 82. As a result, from worse to worst, the accumulated heat inside the circuit element 81 raises up the temperature to the extent causing cracks in the inductance coil portion of the ceramic substrate shown in FIG. 5.

Such is the case that is always experienced by any conventional product. Therefore, aiming at the above depicted defects, the present invention is to propose a newly urbanized externally adjustable RF impedance matching mechanism capable of operating at high power with better impedance coupling result.

SUMMARY OF THE INVENTION

The major object of present invention is aimed to solve the heat dissipation problem. It is designed to separate handling the heated inductance device of the RF high power transmission network. Through the dedicated mechanism design, the circuit element board 3, divides into the heated coil board and auxiliary board, two parts. As to prevent the heat deform of the coil board in the present invention, a plurality of elastic studs is provided at four corner which is made by silicon rubber material can sustain the high power without affect elasticity. With this constant press force, its enable the coil board and base maintain the best thermal conductivity and resulting the best power dissipation condition. For the non-heating element, auxiliary board, thus can be changed to the regular fiber glass printing circuit board and reduce the material and production cost as well. Further more, through the external adjustment mechanism design enable turning the whole RF power transmission network into the best impedance (or inductance) matching condition. It will maintain the heat loss and residue in the coil board during the RF power transmission process. Therefore, the root cause of the over heating, deforming and cracking problems of the conventional products have essentially solved by the present invention.

Accordingly, to achieve the above mentioned object, the RF impedance mechanism of the present invention comprises an upper lid and a base containing a circuit element (impedance or inductance coil) board therein. One or more than one precise adjustment device is secured to the upper lid by several setting screws 4. Each of the screws is interposed through the upper lid and then screw down to the precise adjustment devices 5. And the several spirally coiled springs 6 setting between the upper lid and the precise adjustment device 5 will build up the spring force against the setting screws to screw up the precise adjustment device with the aid of the spring force so as to obtain a relevant value of impedance (or inductance) of the circuit element 31. Moreover, for easily dissipating internally accumulated heat, a heat conductive material is provided by coating between the board of circuit element and the base so that the product of the present invention has better thermal conductance and also can sustain the device operated at high power for a long time. The expensive ceramic substrate is used only to form the coil board 31 part and the reset auxiliary board 32 using the regular fiber glass printed circuit board so that the material and production cost are low.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENT

Figure 1:
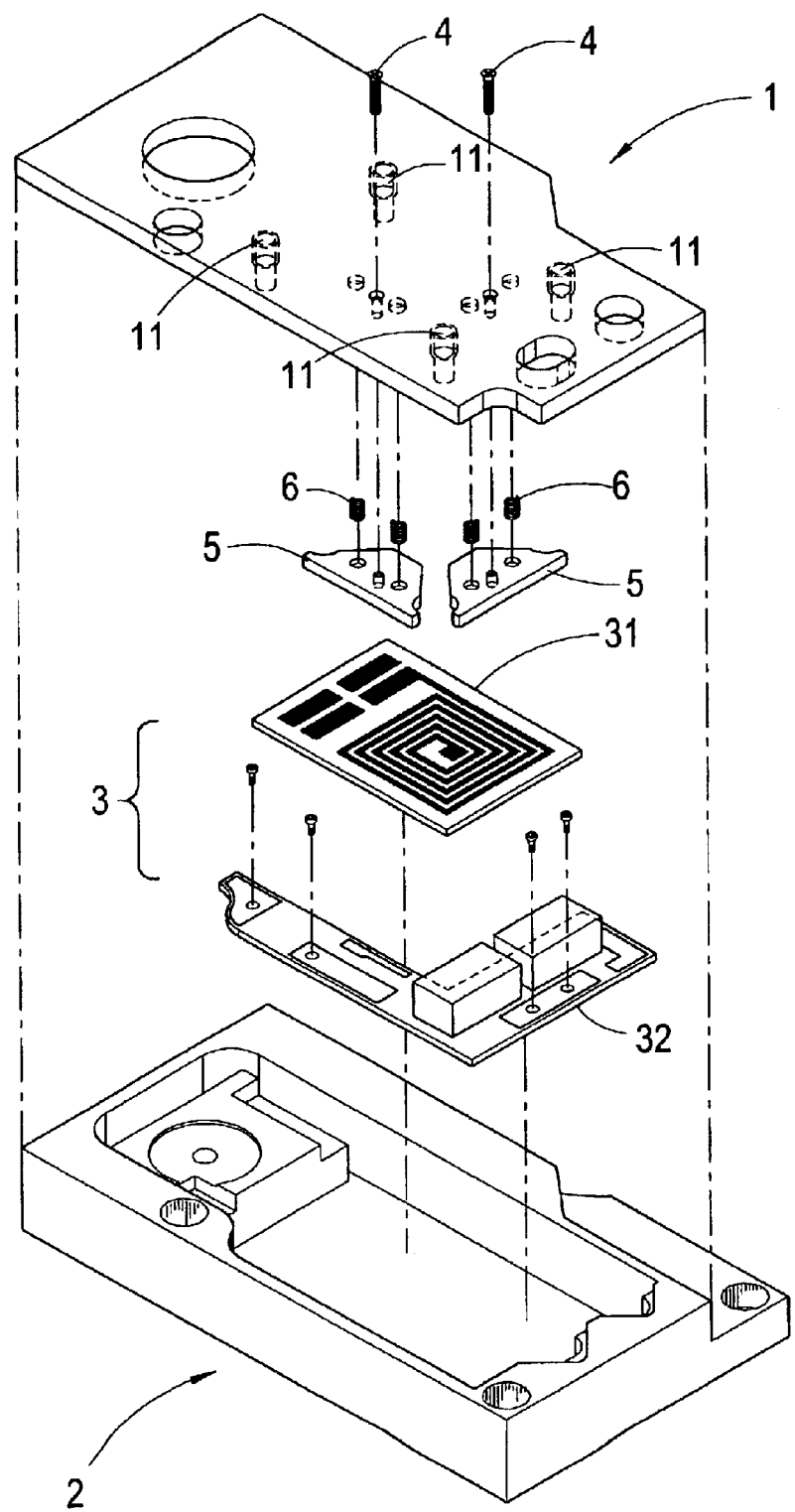
FIG. 1 is an exploded view of the RF impedance matching mechanism of the present invention.

Referring to FIG. 1, the exploded view of the present invention shows that there is a circuit element board 3 contained in the closed space formed between an upper lid 1 and a base 2. The circuit element board 3 includes at least two parts, namely a coil board 31 and an encircling auxiliary board 32. The coil board 31 is made of ceramic material which can last using for a long time, while the auxiliary board 32 is for entraining auxiliary circuit components. As only the essential part, i.e. the coil board 31 is made of expensive ceramic material, the material and production costs are thus able to cut down.

One or more than one precise adjustment device 5 for severing as the RF tuning block to change the proximate impedance (or inductance) of the coil board 31 is provided at an appropriate position under the upper lid 1 by several setting screws4. Each of the screws is interposed through the upper lid 1 and then screw down to the precise adjustment devices 5. And the several coil spring 6 between the upper lid 1 and the precise adjustment device 5 which will build up the spring force against the setting screws to seven up the precise adjustment device 5. With this structure, the setting screw 4 can be turned externally to control the clearance adjustment device 5 and the coil board 31 with the aid of elasticity of the spring 6 so as to tune the impedance (or inductance) to a relevant value and achieve the optimistic RF impedance matching condition. Alternatively, the screw 4 can be fitted to the center portion of the spring 6 such that the two components thereof can act as an integral unit.

Moreover, for easily dissipating internally accumulated heat, a heat conductive material is provided by coating between the circuit element board 3 and the base 2 so that the present invention has better thermal conductance with the optimistic impedance matching condition resulting the less power transmission loss residue in the coil board, enabling the present invention can operate at a high power for a long time.

Figure 2:
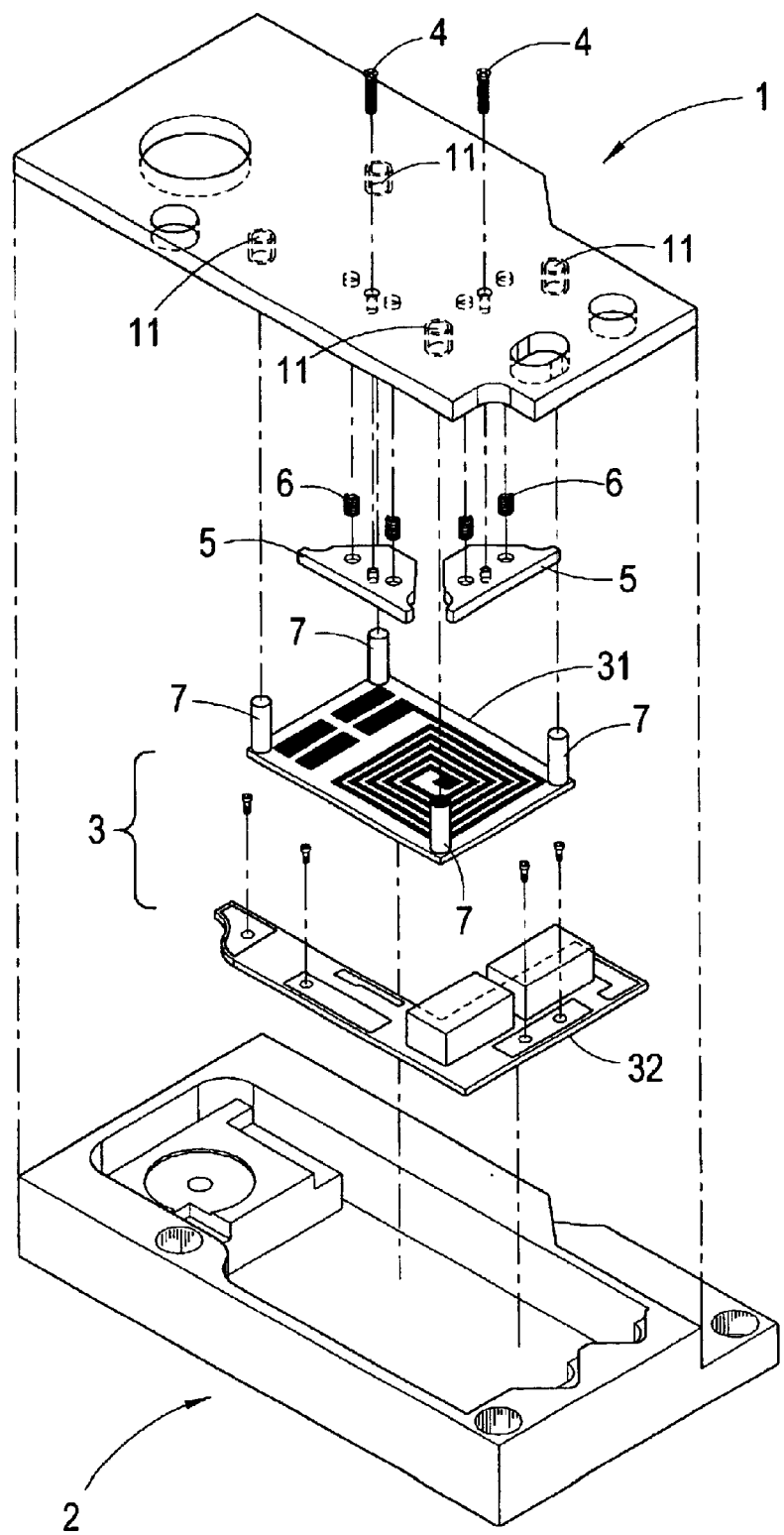
FIG. 2 is another exploded view of the RF impedance matching mechanism of the present invention.

FIG. 2 shows an exploded view in another embodiment of the present invention. In this embodiment, a plurality of elastic studs 7 is provided at four corners of the coil board 31 to apply a uniform pressing force onto the ceramic coil board 31 so that the coil board 31 does not deform concave upwardly after being heated. The elastic stud 7 is made of a soft and heat resistive elastic material, and is aligned through a fitting hole 11 formed on the upper lid 1 down to the coil board 31 for pressing the coil board 31 at an accurate position. With this structure the coil board 31 is more resistive to deformation by heat, and by tight engagement between the coil board 31 and the base 2, the heat conductive material interposed therebetween enable the base 2 serve the heat dissipation function with a maximum efficiency thereby the internal coil board 31 is cooled to a favorable state.

Similar to the first embodiment, one or more than one precise adjustment device 5 is provided at the appropriate position under the upper lid 1. This or these precise adjustment device 5 is secured to the upper lid 1 by several setting screws 4. Each of the screws 4 is interposed at the center a spirally coiled spring 6 and can be turned externally control the clearance between the precise adjustment device 5 and the coil board 31 with the aid of elasticity of the spring 6 so as to tune the impedance (or inductance) to a relevant value and achieve the optimistic RF impedance matching condition.

Figure 3A:
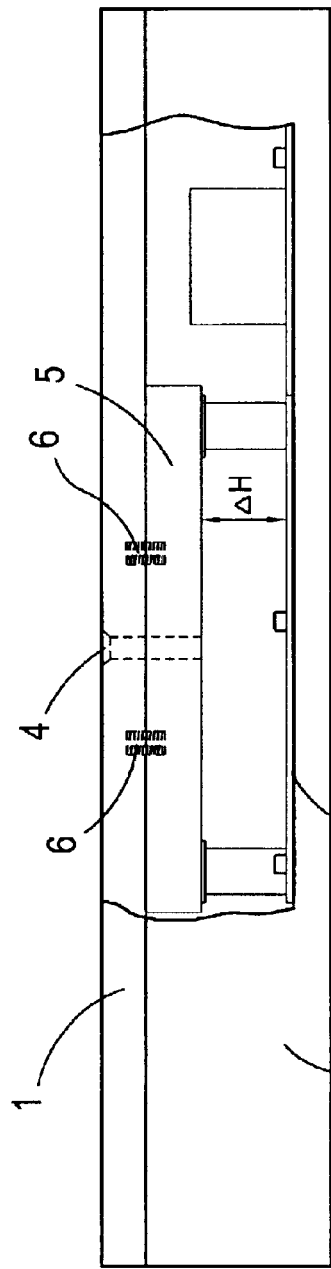
FIGS. 3A and 3B are side cross sectional views of the RF impedance matching mechanism shown in FIG. 1 and FIG. 2 respectively.
Figure 3B:
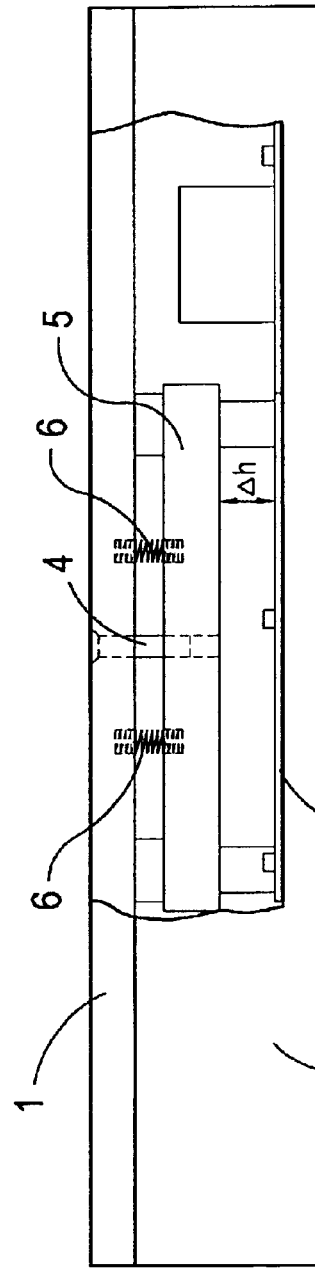
Figure 4:
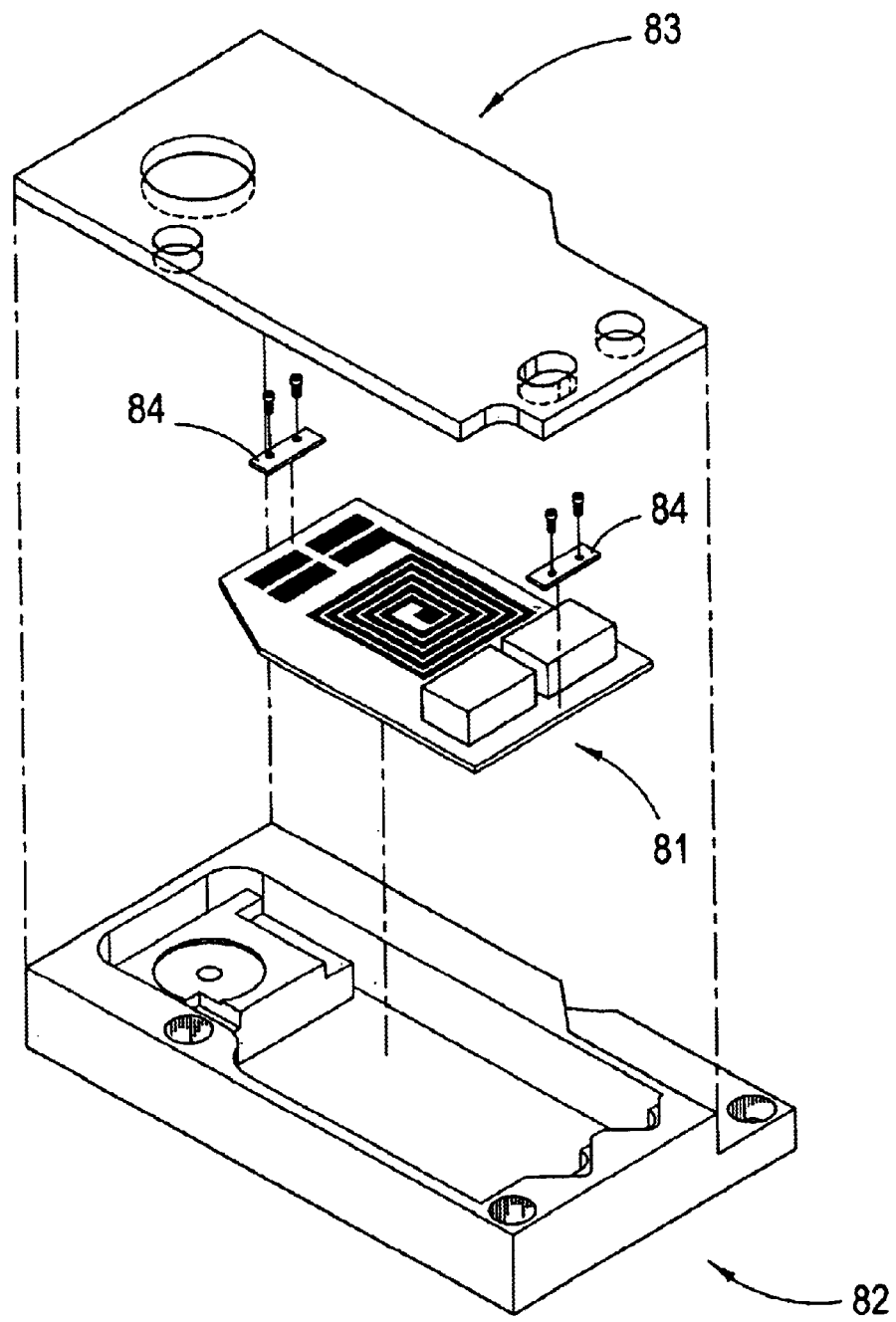
FIG. 4 is an exploded view of a conventional impedance matching mechanism structure.
Figure 5:
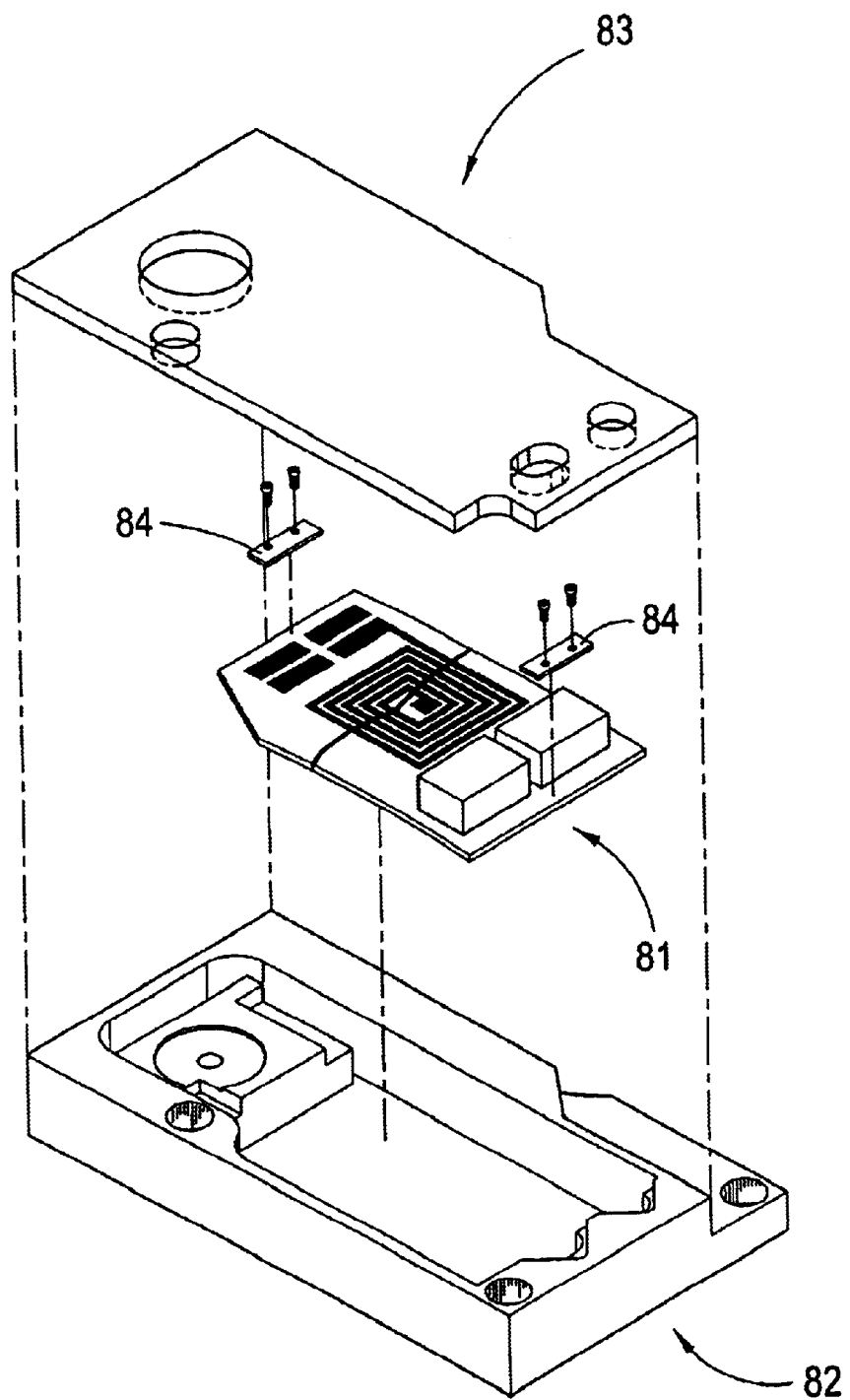
FIG. 5 is an illustrative view showing there is a crack occurred in the circuit board of FIG. 4.

Referring to FIGS. 3A and 3B, in these two side cross sectional views of the present invention, it is illustrated as to how the clearance between the internal precise adjustment device 5 and the coil board 31 can be adjusted by means of turning the setting screws 4 associated with the aid of the springs 6. In FIG. 3A, a clearance ΔH is maintained therebetween. By turning the setting screws 4 to bring down the precise adjustment device 5 closer to the coil board 31, the original clearance ΔH is now shortened to Δh as show in FIG. 3B such that the impedance (or inductance) of the device can be varied.

It is clear from the above detailed description of the present invention has several features which are distinctly superior to any other conventional techniques, and are as follows:

1. The mechanism of the present invention can be produced with minimum cost by using expensive ceramic material only in the essential coil board and the rest auxiliary board could de replaced by the regular fiber glass printing circuit board.

2. The RF impedance (or inductance) can be adjusted very relevantly by means of the precise adjustment device 5. Thus allows the optimistic impedance matching condition can be easily achieved and the power loss during the power transmission will maintain in the minimum status resulting the coil board working in the lower temperature situation. Also it makes the present invention capable to operation at the high power for a long time.

3. The installation of elastic studs at four corners of the coil board applies a uniform pressing force onto the ceramic coil board, to ensure with the base has batter thermal conductance, so that it does not deform concave upwardly after being heated, and thus also allows the device to operate at the term high power more reliable.

Although the invention has been described in terms of preferred embodiments, it is apparent that numerous variations and modifications may be made without departing from the true spirit and scope thereof as set forth in the following claims.

What is claimed is:

1. An externally adjustable RE impedance matching mechanism comprising:
   a) a base and an upper lid;
   b) a circuit element board located between the base and the upper lid; and
   c) at least one precise adjustment device having:
      i) a plurality of springs; and
      ii) at least one adjustment screw located between the plurality of springs and adjustably connecting one of the precise adjustment device to the upper lid, wherein each adjustment screw selectively moves one precise adjustment device to a predetermined distance from the circuit element board to adjust an RF impedance of the circuit element board, each of the plurality of springs pressing the at least one precise adjustment device away from the upper lid.

2. The externally adjustable RF impedance matching mechanism according to claim 1, wherein the circuit element board includes a coil board and an auxiliary board encircling the coil board.

3. The externally adjustable RF impedance matching mechanism according to claim 1, further comprising a plurality of elastic studs located on corners of the coil board between the coil board and the upper lid, the plurality of elastic studs pressing the coil board against the base.

4. The externally adjustable RF impedance matching mechanism according to claim 1, wherein the upper lid includes a plurality of fitting holes, the pluray of elastic studs aligning with the plurality of fitting holes.

5. The externally adjustable RF impedance matching mechanism according to claim 2, wherein the coil board is made of a ceramic material.

6. The externally adjustable RF impedance matching mechanism according to claim 3, wherein each of the plurality of elastic studs is made of a soft and heat resistant elastic material.

7. The externally adjustable RF impedance matching mechanism according to claim 1, wherein the upper lid includes a plurality of recessed slots, each of the plurality of springs aligning with and located in one of the plurality of recessed slots.

* * * * *